US009484502B2

(12) United States Patent
Konishi et al.

(10) Patent No.: US 9,484,502 B2
(45) Date of Patent: Nov. 1, 2016

(54) LIGHT EMITTING DEVICE AND METHOD FOR MANUFACTURING THE SAME

(71) Applicant: Sharp Kabushiki Kaisha, Osaka-shi (JP)

(72) Inventors: Masahiro Konishi, Osaka (JP); Makoto Agatani, Osaka (JP); Toshio Hata, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/245,974

(22) Filed: Apr. 4, 2014

(65) Prior Publication Data

US 2014/0339594 A1 Nov. 20, 2014

Related U.S. Application Data

(60) Continuation of application No. 13/786,393, filed on Mar. 5, 2013, now Pat. No. 8,841,838, which is a division of application No. 12/916,048, filed on Oct. 29, 2010, now Pat. No. 8,427,048, which is a continuation of application No. 12/049,690, filed on Mar. 17, 2008, now Pat. No. 7,843,131.

(30) Foreign Application Priority Data

Mar. 15, 2007 (JP) ................. 2007-067362

(51) Int. Cl.
*H01L 33/50* (2010.01)
*F21K 99/00* (2016.01)
(Continued)

(52) U.S. Cl.
CPC ............... *H01L 33/502* (2013.01); *F21K 9/00* (2013.01); *F21K 9/30* (2013.01); *F21V 23/002* (2013.01);
(Continued)

(58) Field of Classification Search
CPC ..... H01L 33/502; H01L 33/32; H01L 33/36; H01L 33/38; H01L 33/56; H01L 33/60; H01L 33/62; F21K 9/00; F21K 9/30; F21K 9/135
See application file for complete search history.

(56) References Cited

U.S. PATENT DOCUMENTS 5,353,498 A 10/1994 Fillion et al.
5,513,411 A 5/1996 Simon
(Continued)

FOREIGN PATENT DOCUMENTS

CN 1441486 9/2003
CN 1866532 11/2006
(Continued)

OTHER PUBLICATIONS

Konishi, M. et al., U.S. Office Action mailed Jul. 24, 2013, directed to U.S. Appl. No. 13/786,393; 9 pages.
(Continued)

*Primary Examiner* — Anne Hines
(74) *Attorney, Agent, or Firm* — Morrison & Foerster LLP

(57) ABSTRACT

By using a light emitting device including an insulating substrate and a light emitting unit formed on the insulating substrate, the light emitting unit including: a plurality of linear wiring patterns disposed on the insulating substrate in parallel with one another, a plurality of light emitting elements that are mounted between the wiring patterns while being electrically connected to the wiring patterns, and a sealing member for sealing the light emitting elements, as well as a method for manufacturing thereof, it becomes possible to provide a light emitting device that achieves sufficient electrical insulation and has simple manufacturing processes so that it can be manufactured at a low cost, and a method for manufacturing the same.

19 Claims, 11 Drawing Sheets

(51) Int. Cl.

| | | |
|---|---|---|
| *H01L 33/62* | (2010.01) | |
| *H01L 33/36* | (2010.01) | |
| *F21V 23/00* | (2015.01) | |
| *H01L 33/38* | (2010.01) | |
| *H01L 25/075* | (2006.01) | |
| *H01L 33/32* | (2010.01) | |
| *H01L 33/56* | (2010.01) | |
| *H01L 33/60* | (2010.01) | |
| *H01L 33/64* | (2010.01) | |
| *F21Y 101/02* | (2006.01) | |
| *H01L 23/00* | (2006.01) | |
| *F21Y 105/00* | (2016.01) | |

(52) U.S. Cl.
CPC ........... *H01L 25/0753* (2013.01); *H01L 33/32* (2013.01); *H01L 33/36* (2013.01); *H01L 33/38* (2013.01); *H01L 33/56* (2013.01); *H01L 33/60* (2013.01); *H01L 33/62* (2013.01); *H01L 33/641* (2013.01); *F21K 9/135* (2013.01); *F21Y 2101/02* (2013.01); *F21Y 2105/001* (2013.01); *H01L 24/45* (2013.01); *H01L 2224/45124* (2013.01); *H01L 2224/45144* (2013.01); *H01L 2224/45147* (2013.01); *H01L 2224/45169* (2013.01); *H01L 2224/48091* (2013.01); *H01L 2924/01015* (2013.01); *H01L 2924/01047* (2013.01); *H01L 2924/01068* (2013.01); *H01L 2924/01087* (2013.01); *H01L 2924/09701* (2013.01); *H01L 2924/12041* (2013.01); *H01L 2924/3011* (2013.01); *H01L 2924/3025* (2013.01)

(56) References Cited

U.S. PATENT DOCUMENTS

| | | | |
|---|---|---|---|
| 5,847,512 | A | 12/1998 | Baba et al. |
| 6,489,637 | B1 | 12/2002 | Sakamoto et al. |
| 6,942,360 | B2 | 9/2005 | Chou et al. |
| 8,427,048 | B2 | 4/2013 | Konishi et al. |
| 2001/0032985 | A1 | 10/2001 | Bhat et al. |
| 2003/0174483 | A1 | 9/2003 | Yuzawa |
| 2003/0189829 | A1 | 10/2003 | Shimizu et al. |
| 2004/0065894 | A1 | 4/2004 | Hashimoto et al. |
| 2004/0208210 | A1 | 10/2004 | Inoguchi |
| 2004/0217692 | A1 | 11/2004 | Cho et al. |
| 2005/0239227 | A1 | 10/2005 | Aanegola et al. |
| 2006/0091779 | A1 | 5/2006 | Takeda et al. |
| 2006/0099449 | A1 | 5/2006 | Amano et al. |
| 2006/0157722 | A1 | 7/2006 | Takezawa et al. |
| 2006/0171135 | A1 | 8/2006 | Ishizaka et al. |
| 2006/0227558 | A1 | 10/2006 | Osawa et al. |
| 2006/0274421 | A1 | 12/2006 | Okamitsu et al. |
| 2006/0284195 | A1 | 12/2006 | Nagai |
| 2007/0023765 | A1 | 2/2007 | Thomas et al. |
| 2007/0041185 | A1 | 2/2007 | Yatsuda et al. |
| 2007/0103939 | A1 | 5/2007 | Huang et al. |
| 2007/0176193 | A1 | 8/2007 | Nagai |
| 2007/0200133 | A1 | 8/2007 | Hashimoto et al. |
| 2008/0036362 | A1 | 2/2008 | Tanimoto et al. |
| 2009/0108273 | A1 | 4/2009 | Sakai et al. |
| 2010/0046220 | A1 | 2/2010 | Fukasawa et al. |

FOREIGN PATENT DOCUMENTS

| | | |
|---|---|---|
| EP | 1 357 331 | 10/2003 |
| JP | 4-8454 | 1/1992 |
| JP | 4-65464 | 6/1992 |
| JP | 4-113466 | 10/1992 |
| JP | 5-59705 | 8/1993 |
| JP | 7-250207 | 9/1995 |
| JP | 2001-44512 | 2/2001 |
| JP | 2002-9349 | 1/2002 |
| JP | 2002-336275 | 11/2002 |
| JP | 2003-8083 | 1/2003 |
| JP | 2003-124528 | 4/2003 |
| JP | 2003-152225 | 5/2003 |
| JP | 2003-347593 | 12/2003 |
| JP | 2004-103266 | 4/2004 |
| JP | 2004-172577 A | 6/2004 |
| JP | 2004-179644 A | 6/2004 |
| JP | 2004-200537 A | 7/2004 |
| JP | 2004-265724 | 9/2004 |
| JP | 2005-26619 A | 1/2005 |
| JP | 2005-32999 | 2/2005 |
| JP | 2005-101283 | 4/2005 |
| JP | 2005-109434 | 4/2005 |
| JP | 2005-252222 | 9/2005 |
| JP | 2005-340472 A | 12/2005 |
| JP | 2006-49715 | 2/2006 |
| JP | 2006-86469 A | 3/2006 |
| JP | 2006-165326 | 6/2006 |
| JP | 2006-173326 | 6/2006 |
| JP | 2006-186297 | 7/2006 |
| JP | 2006-210949 | 8/2006 |
| JP | 2006-222412 | 8/2006 |
| JP | 2006-287020 | 10/2006 |
| JP | 2006-295084 | 10/2006 |
| JP | 2006-295085 | 10/2006 |
| JP | 2006-313727 | 11/2006 |
| JP | 2006-313731 | 11/2006 |
| JP | 2006-319290 | 11/2006 |
| JP | 2006-525679 | 11/2006 |
| JP | 2006-332234 | 12/2006 |
| JP | 2006-351708 | 12/2006 |
| JP | 3128613 | 1/2007 |
| JP | 2007-41467 | 2/2007 |
| TW | M289865 | 4/2006 |
| TW | 200620708 | 6/2006 |
| WO | WO-2004/100343 | 11/2004 |

OTHER PUBLICATIONS

Japanese Office Action mailed Dec. 9, 2009, directed to counterpart Japanese Application No. 2007-067362; 5 pages.

Konishi, M. et al. U.S. Office Action mailed Feb. 3, 2010, directed to U.S. Appl. No. 12/049,690; 12 pages.

Konishi, M. et al. U.S. Office Action mailed Apr. 16, 2012, directed to U.S. Appl. No. 12/916,048; 9 pages.

Konishi, M. et al. U.S. Office Action mailed Sep. 25, 2012, directed to U.S. Appl. No. 12/916,048; 12 pages.

Konishi et al., U.S. Office Action mailed Apr. 10, 2015, directed to U.S. Appl. No. 14/638,672; 10 pages.

CHROMATICITY COORDINATES

LIGHT EMITTING DEVICE AND METHOD FOR MANUFACTURING THE SAME

CROSS-REFERENCE TO RELATED APPLICATIONS

This application is a continuation of U.S. patent application Ser. No. 13/786,393, filed Mar. 5, 2013, which is a divisional of U.S. patent application Ser. No. 12/916,048, filed Oct. 29, 2010, now U.S. Pat. No. 8,427,048, issued Apr. 23, 2013, which is a continuation of U.S. patent application Ser. No. 12/049,690, filed Mar. 17, 2008, now U.S. Pat. No. 7,843,131, issued Nov. 30, 2010, which is based on Japanese Patent Application No. 2007-067362, filed with the Japan Patent Office on Mar. 15, 2007, the entire contents of which are hereby incorporated by reference.

FIELD OF THE INVENTION

The present invention relates to a light emitting device and a method for manufacturing the same.

BACKGROUND OF THE INVENTION

In recent years, LEDs have come to be used frequently as light sources for illumination apparatuses. Methods for obtaining white light in the illumination apparatus using LEDs include, for example, a method using three kinds of LEDs, that is, a red LED, a blue LED, and a green LED, and a method utilizing a fluorescent material that converts excited light from a blue LED to emit yellow light. With respect to the light sources for illumination apparatuses, since white light having sufficient luminance is required, illumination apparatuses using a plurality of LED chips have been commercialized.

For one example of such an illumination apparatus, Japanese Patent Laying-Open No. 2003-152225 (Patent Document 1) discloses a light emitting device 101 as schematically shown in FIG. 14. Light emitting device 101 shown in FIG. 14 has a structure in which element storage units 103, each having a concave shape, are formed on a metal plate 102 made of aluminum, and a printed circuit board 104, which is an insulating glass epoxy substrate with a wiring unit 105 made of copper foil being placed thereon, is formed between the element storage units. Moreover, in the example shown in FIG. 14, a light emitting element 106, placed (disposed) on each element storage unit 103, and wiring unit 105 on printed circuit board 104 are electrically connected with each other through a bonding wire 107. Furthermore, these element storage units 103 are sealed by a resin sealing member 108 in such a manner as to cover all light emitting device 106 and bonding wire 107. Patent Document 1 describes that, with this structure, it is possible to provide a light emitting device that improves the heat radiating property and is capable of effectively taking out light to the outside from the light emitting diode chip.

However, in light emitting device 101 shown in FIG. 14, printed circuit board 104, with wiring unit 105 made of copper foil being formed thereon, is disposed in the immediate vicinity of metal plate 102 made of aluminum (in the Figure, a linear distance d with respect to the horizontal direction is shown as a distance between metal plate 102 and wiring unit 105). For this reason, the resulting assumption is that sufficient electrical insulation is not achieved between metal plate 102 and wiring unit 105. Moreover, since light emitting device 101 as shown in FIG. 14 has printed circuit board 104 formed of a glass epoxy substrate, complicated manufacturing processes are required, thereby failing to provide a light emitting device at a low cost.

For example, Japanese Patent Laying-Open No. 2006-287020 (Patent Document 2) discloses a LED member 201 as schematically shown in FIG. 15. LED member 201 shown in FIG. 15 has a structure in which a heat radiating plate 203 made of metal or ceramics, with a LED chip 204 being mounted thereon, is joined in a through hole formed in a wiring board 202. In the example shown in FIG. 15, LED chip 204 and a wiring pattern 205 formed in wiring board 202 are electrically connected with each other by a bonding wire W, and these LED chip 204 and bonding wire W are embedded with a resin sealing member 206 made of a transparent resin. Patent Document 2 describes that, with this structure, the heat generation of the LED chip is effectively released, so that it becomes possible to provide a surface-packaging type LED member with good productivity, and a method for manufacturing the same.

In Patent Document 2, however, no detailed description is given as to the method for applying the transparent resin used for embedding LED chip 204 and bonding wire W. Moreover, in LED member 201 shown in FIG. 15 of Patent Document 2, since wiring pattern 205 is formed on side faces of wiring board 202 as well as on one portion of the back face, it is difficult to manufacture such a structure, resulting in a failure to manufacture the member at a low cost.

SUMMARY OF THE INVENTION

The present invention has been made to solve the above-mentioned problems, and its object is to provide a light emitting device that achieves sufficient electrical insulation, and has simple manufacturing processes so that it can be manufactured at a low cost, and a method for manufacturing the same.

A light emitting device in accordance with the present invention is a light emitting device including an insulating substrate and a light emitting unit formed on the insulating substrate, characterized in that the light emitting unit has a plurality of linear wiring patterns disposed on the insulating substrate in parallel with one another, a plurality of light emitting elements that are mounted between the wiring patterns while being electrically connected to the wiring patterns, and a sealing member for sealing the light emitting elements.

In the light emitting device of the present invention, more than one light emitting elements are preferably mounted with each of the linear wiring patterns being sandwiched therebetween, to be linearly aligned along the wiring patterns. Moreover, the light emitting elements mounted with each of the linear wiring patterns being sandwiched therebetween are preferably disposed in a mutually shifted state so as not to allow side faces thereof to oppose one another.

Moreover, in the light emitting device of the present invention, the light emitting elements each of which has a rectangular shape in top view are preferably mounted such that a direction along a short side thereof is parallel with a longitudinal direction of the wiring patterns, and more preferably, each of the light emitting elements has an elongated shape in top view.

In the light emitting device of the present invention, preferably, the light emitting elements mounted with each of the linear wiring patterns being sandwiched therebetween are electrically connected in series with one another. More preferably, the light emitting elements linearly mounted along the linear wiring patterns are electrically connected in parallel with one another.

In the light emitting device of the present invention, preferably, the wiring patterns further include a pattern for positioning electrical connections between the light emitting elements, or a pattern serving as a measure for mounting positions of the light emitting elements.

In the light emitting device of the present invention, a linear distance between each light emitting element and each wiring pattern is preferably 0.1 mm or more.

In the light emitting device of the present invention, the insulating substrate is preferably formed of a white ceramic substrate, and the white ceramic substrate is made of any material selected from aluminum oxide, aluminum nitride, boron nitride, silicon nitride, magnesium oxide, forsterite, steatite and low-temperature sintered ceramics, or a composite material of these materials.

In the light emitting device of the present invention, the linear wiring patterns and light emitting elements on the insulating substrate are preferably sealed by a single sealing member.

Moreover, in the light emitting device of the present invention, the sealing member preferably contains a fluorescent material, and the sealing member more preferably includes a first sealing member layer containing a first fluorescent material and a second sealing member layer that contains a second fluorescent material and is laminated on the first sealing member layer. In this case, the second sealing member layer is preferably laminated on the first sealing member layer so as to cover at least one portion of the first sealing member layer.

In the light emitting device of the present invention, the sealing member is preferably formed into a hexagonal shape, a round shape, a rectangular shape, or a square shape in top view.

Moreover, the light emitting device of the present invention is preferably formed into a round shape or a square shape in top view.

The light emitting device of the present invention is preferably used for a backlight light source of a liquid crystal display or a light source for illumination.

The present invention also provides a method for manufacturing a light emitting device including the steps of: forming wiring patterns on an insulating substrate; mounting a light emitting element between the wiring patterns; electrically connecting the light emitting element and the wiring patterns; placing a silicone rubber sheet having a through hole onto the insulating substrate; and forming a sealing member for sealing the light emitting element in the through hole of the silicone rubber sheet.

The method for manufacturing a light emitting device of the present invention preferably further includes the steps of: inspecting a characteristic of the light emitting element after electrically connecting the light emitting element with the wiring patterns; and upon detection of any defect in characteristics as a result of the inspection, connecting a spare light emitting element with the wiring patterns.

In the method for manufacturing a light emitting device of the present invention, the sealing member preferably contains a fluorescent material. In this case, in the method for manufacturing a light emitting device of the present invention, the step of sealing the light emitting elements by using the sealing member preferably includes the steps of: injecting a sealing material containing a first fluorescent material into the through hole of the silicone rubber sheet; curing the sealing material containing the first fluorescent material to form a first sealing member layer; and measuring a chromaticity characteristic of the light emitting device after the first sealing member layer is formed. Moreover, in the method for manufacturing a light emitting device of the present invention, the step of sealing the light emitting element by using the sealing member preferably includes the steps of: after the step of measuring a chromaticity characteristic of the light emitting device after the first sealing member layer is formed, injecting a sealing material containing a second fluorescent material onto the first sealing member layer; curing the sealing material containing the second fluorescent material to form a second sealing member layer; measuring a chromaticity characteristic of the light emitting device after the second sealing member layer is formed; and removing the silicone rubber sheet.

In accordance with the present invention, it becomes possible to provide a light emitting device that achieves sufficient electrical insulation, and has simple manufacturing processes so that it can be manufactured at a low cost, and a method for manufacturing the same. Moreover, the light emitting device of the present invention has an improved color rendering property in comparison with conventional devices, and is less likely to cause color shifts; therefore, it is suitably applicable to a liquid crystal display and a light source for illumination.

The foregoing and other objects, features, aspects and advantages of the present invention will become more apparent from the following detailed description of the present invention when taken in conjunction with the accompanying drawings.

DETAILED DESCRIPTION OF THE INVENTION

Figure 1:
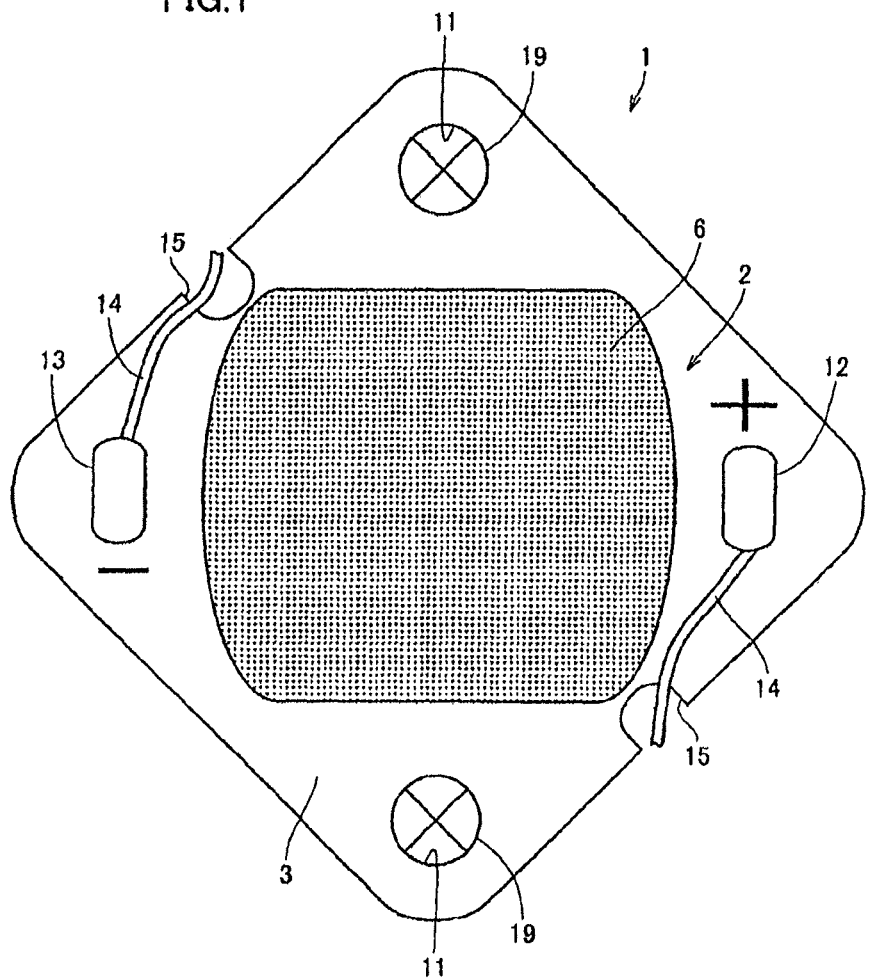
FIG. 1 is a top view schematically showing a light emitting device 1 in accordance with a first preferred example of the present invention.
Figure 2:
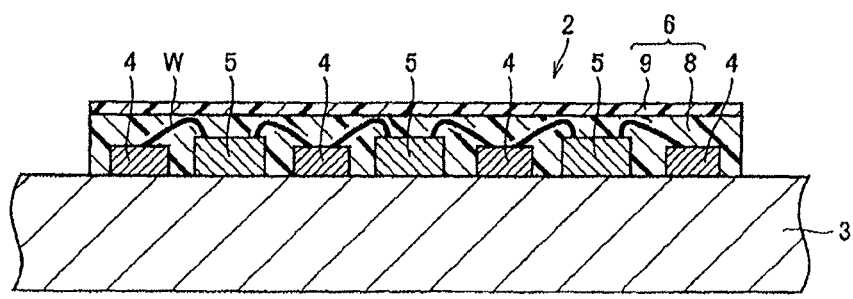
FIG. 2 is a cross-sectional view schematically showing a light emitting unit 2 in light emitting device 1 of the example shown in FIG. 1.
Figure 3:
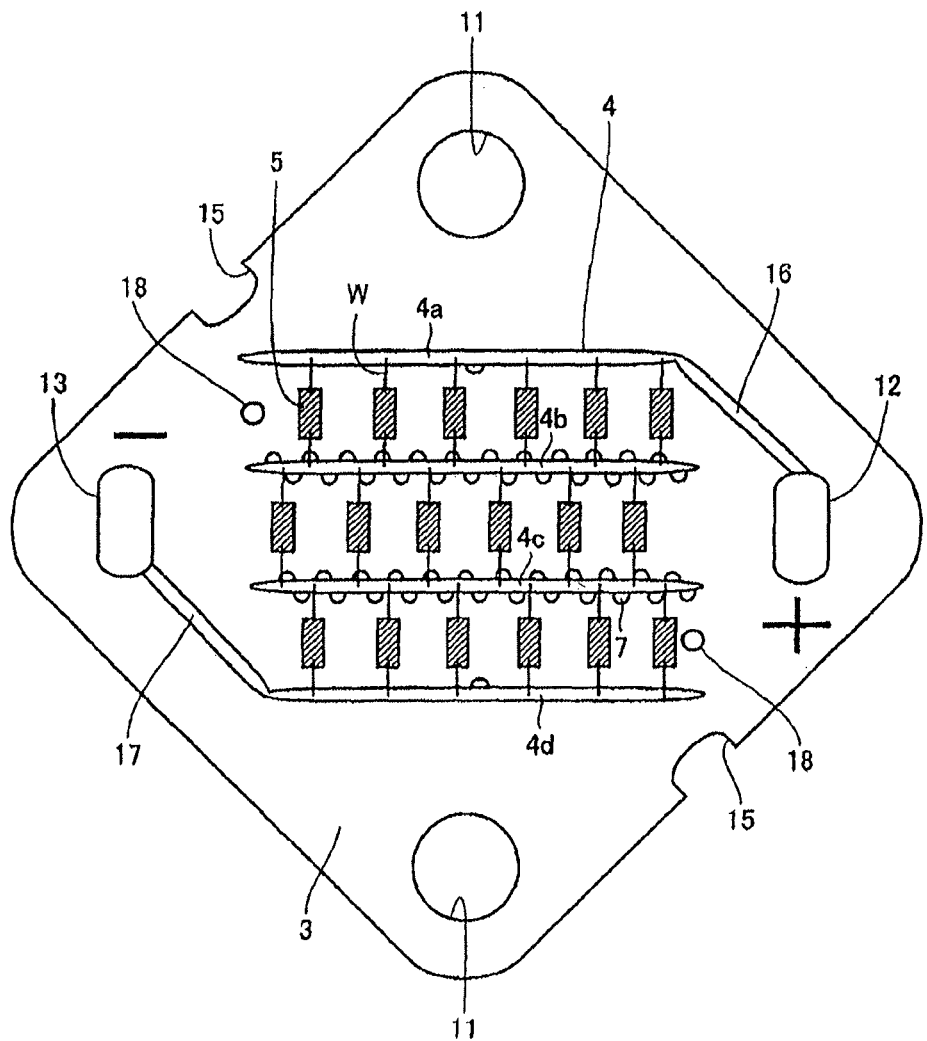
FIG. 3 is a top view schematically showing an insulating substrate 3 in light emitting device 1 of the example shown in FIG. 1.

FIG. 1 is a top view of a light emitting device 1 in accordance with a first preferred example of the present invention, and FIG. 2 is a cross-sectional view schematically showing a light emitting unit 2 in light emitting device 1 of the example shown in FIG. 1. FIG. 3 is a top view schematically showing an insulating substrate 3 in light emitting device 1 of the example shown in FIG. 1. Light emitting device 1 of the present invention has a structure in which a plurality of linear wiring patterns 4 are formed on an insulating substrate 3 in parallel with one another, with a plurality of light emitting elements 5 being mounted between wiring patterns 4 while being electrically connected to wiring patterns 4, and is provided with a light emitting unit 2 sealed by a sealing member 6. In particular, light emitting device 1 of the present invention makes it possible to increase a dielectric voltage between the adjacent light emitting elements as well as between the light emitting elements and the electrodes, by directly mounting light emitting elements 5 onto insulating substrate 3.

Figure 14:
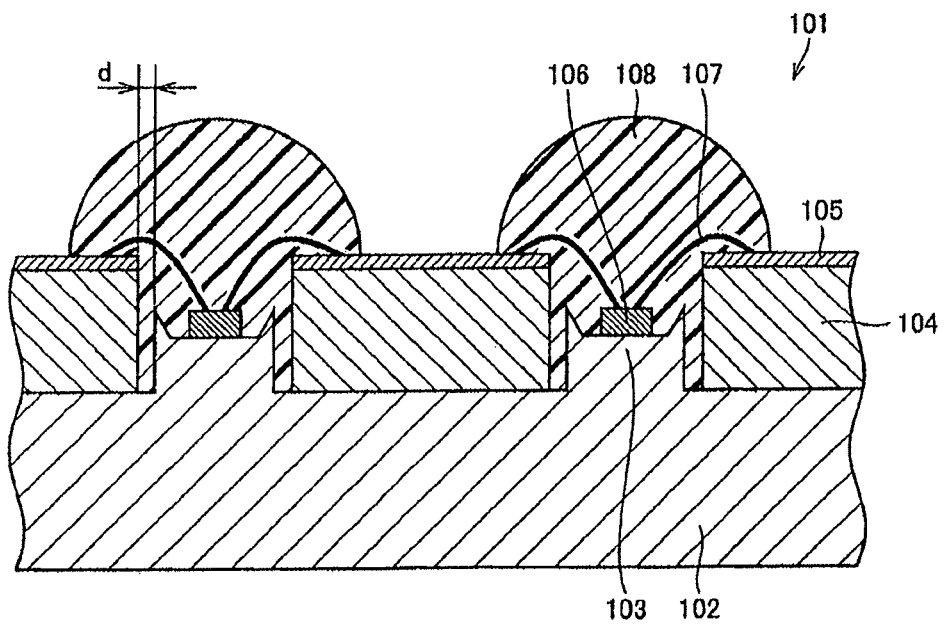
FIG. 14 is a cross-sectional view schematically showing a typical conventional light emitting device 101.
Figure 15:
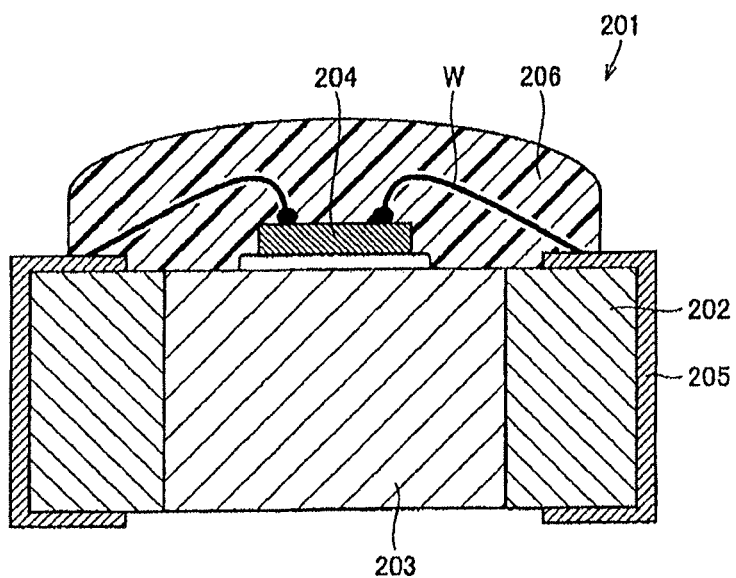
FIG. 15 is a cross-sectional view schematically showing a typical conventional LED member 201.

In accordance with light emitting device 1 of the present invention, between linear wiring patterns 4 that are formed on insulating substrate 3, the plurality of light emitting elements 5 that are electrically connected to wiring patterns 4 are mounted so that, unlike a conventional structure in which an insulating layer having wiring unit on printed circuit board is formed on a metal substrate, a sufficient electrical insulating property is achieved. That is, as described above, in the structure as shown in the conventional example of FIG. 14, since a printed circuit board 104 with a wiring unit 105 formed thereon is disposed in the immediate vicinity of a metal plate 102 on which the light emitting elements are mounted, it is difficult to achieve sufficient electrical insulation. In this structure, in order to achieve sufficient electrical insulation without the necessity of isolation by using an insulating material, it is necessary to ensure a sufficient length for a linear distance d in the horizontal direction between metal plate 102 and wiring unit 105. In contrast, in light emitting device 1 of the present invention, since wiring patterns 4 are directly formed on insulating substrate 3, and light emitting elements 5 are directly mounted on insulating substrate 3 so that light emitting elements 5 and wiring patterns 4 are electrically connected through a bonding wire W; thus, the light emitting device can be designed without the necessity of taking into consideration the above-mentioned linear distance, and the manufacturing processes can be carried out easily. Moreover, in light emitting device 1 of the present invention, since the structure does not require forming of an insulating layer on the metal plate, it is possible to omit the process for forming an insulating layer on a metal plate in manufacturing, and consequently to make the manufacturing processes more easier from this viewpoint as well.

Moreover, in the case where a light emitting device with a single light emitting element having strong light emitting intensity is allowed to emit light, light emission in the form of a bright spot is given, with the result that, since it is dazzling to human eyes, the application thereof is limited. In light emitting device 1 of the present invention, since a plurality of light emitting elements 5 are provided, it is possible to achieve uniform light emission without causing the light emission in the form of a bright spot, and consequently to make it usable for a wide range of applications. Furthermore, in light emitting device 1 of the present invention, along each of a plurality of linear wiring patterns 4 that are formed in parallel with one another, mounting positions of a plurality of light emitting elements 5 can be freely set as needed, so that the luminance adjustment and chromaticity adjustment of light emitting device 1 can be easily carried out. Moreover, in this light emitting device 1, the mounting positions of light emitting elements 5 can be set such that the heat generation of the light emitting elements is not concentrated, thereby making it possible to provide an appropriate heat releasing measure. Moreover, since light emitting device 1 of the present invention makes it possible to adjust the number of light emitting elements to be mounted, all the light fluxes and the power consumption can be adjusted in accordance with desired specifications.

In light emitting device 1 of the present invention, the plurality of light emitting elements 5 are preferably mounted linearly along each wiring pattern so as to allow each linear wiring pattern to be sandwiched between light emitting elements 5. With respect to the number of the wiring patterns in the light emitting device of the present invention, although not particularly limited, since one or more anode wiring patterns and cathode wiring patterns are required, at least two or more wiring patterns are required, so that the number is preferably within a range from two to four. In order to obtain all the light fluxes of 300 lm from the light emitting device at the time of an electric current of 350 mA, thirty-six light emitting elements are required. In this case, wiring patterns 4 are prepared to include four wiring patterns 4a, 4b, 4c and 4d, and twelve light emitting elements 5 are mounted between wiring patterns 4a and 4b, twelve of them are mounted between wiring patterns 4b and 4c, and twelve of them are also mounted between wiring patterns 4c and 4d (examples shown in FIGS. 1 to 3).

It should be noted that FIGS. 1 to 3 show examples in which light emitting device 1 has a square top shape, and in this case, as shown in FIG. 3, linear wiring patterns 4 are preferably formed so as to be parallel to one of the diagonal lines of the square shape that is a top shape of light emitting device 1. By forming wiring patterns 4 in this manner, the lengths and intervals of wiring patterns 4 can be ensured sufficiently, and areas used for forming securing holes, external wiring holes and the like of the light emitting device, which will be described later, can also be ensured advantageously. It should be noted that the above-mentioned top shape of the light emitting device refers to a shape of insulating substrate 3 on a cross section in parallel with the substrate face.

Moreover, in light emitting device 1 of the present invention, respective light emitting elements 5 mounted with each wiring pattern 4 being sandwiched therebetween are preferably disposed in a shifted manner so that the side faces thereof do not oppose one another. FIG. 2 shows an example in which respective light emitting element 5 mounted with each wiring pattern 4 being sandwiched therebetween are disposed so that the side faces thereof oppose one another, and FIG. 3 shows an example in which said light emitting element 5 are disposed so that the side faces thereof do not oppose one another. By disposing light emitting elements 5 as shown in the example of FIG. 3, advantages such as a uniform luminance and reduction in luminance irregularities can be obtained.

Moreover, in light emitting device 1 of the present invention, a light emitting element 5 having a rectangular shape in top view is preferably used. The top shape of light emitting element 5 herein refers to a shape on a top view in parallel with the substrate face of insulating substrate 3 in a mounted state on insulating substrate 3. With respect to light emitting element 5 having a rectangular shape in top view, specifically, a light emitting element having a short side in a range of 200 to 300 μm and a long side in a range of 400 to 1000 μm in the top shape is exemplified. In the light emitting device of the present invention, when light emitting elements 5 having such a rectangular shape in top view are used, light emitting elements 5 are preferably mounted in such a manner as to make the direction along the short side of the top shape of each of light emitting elements 5 in parallel with the longitudinal direction of wiring patterns 4. Normally, each light emitting element 5 having a rectangular shape in top view has its electrode pad formed on the upper face on one of the short sides; therefore, by mounting light emitting elements 5 in the above-mentioned manner, the electrical connection between the electrode pad of light emitting element 5 and wiring pattern 4 by the use of a bonding wire W can be easily carried out, so that it becomes possible to prevent defects such as cutting of bonding wire W and peeling of bonding wire W. Moreover, with this arrangement, a desired number of light emitting elements 5 can be mounted at desired intervals along the longitudinal direction of wiring patterns 4, so that it becomes possible to easily carry out adjustment to obtain desired light.

As described above, light emitting element 5 having a rectangular shape in top view is preferably used in light emitting device 1 of the present invention, and normally, by forming the electrode pad on one of the short sides on the upper face of each light emitting element as described above, light emitting element 5 is easily electrically connected to wiring pattern 4 using bonding wire W; thus, since the effects of preventing defects such as cutting and peeling of bonding wire W are prominent, light emitting element 5 having an elongated top shape is preferably used for light emitting device 1 of the present invention. The "elongated shape" herein refers to a shape in which, in a top shape, the length of a long side is conspicuously long with respect to the length of a short side, and, for example, a light emitting element having a top shape with 480 μm-long side and 240 μm-short side is exemplified. In the case where a light emitting element having the elongated top shape is used, the light emitting element, in which electrode pads are provided on both of the short sides on the upper face so as to oppose one another, is preferably used.

In light emitting device 1 of the present invention, how to electrically connect the linear wiring patterns 4 disposed in parallel with one another and light emitting elements 5 is not particularly limited, and light emitting elements 5 mounted with each linear wiring pattern 4 sandwiched therebetween may be electrically connected in series with one another, or may be electrically connected in parallel with one another. Light emitting elements 5 mounted with each linear wiring pattern 4 sandwiched therebetween may be electrically connected in series with one another, and light emitting elements 5 linearly mounted along the linear wiring patterns may be electrically connected in parallel with one another. It should be noted that the distance between the light emitting element and the electrode is preferably made closer because the closer the distance is, the smaller the voltage drop due to the resistance of the wiring becomes. Further, with respect to the light emitting elements linearly disposed along each wiring pattern, preferably, all of them are not electrically connected to electrodes, with some of the light emitting elements being merely mounted as spare light emitting elements. With this arrangement, in the case where some of the light emitting elements are found to be defective that do not emit light in an inspection process (which will be described later) prior to a sealing process of the light emitting elements by a sealing member, the spare light emitting elements can be electrically connected to the electrodes so as to ensure predetermined brightness.

Moreover, in the light emitting device of the present invention, the wiring patterns preferably further include a positioning pattern for use in electrical connection to the light emitting elements or a pattern serving as a measure for mounting positions of the light emitting elements. FIG. 3 shows an example in which patterns 7 are formed as dots, and connected to four linear wiring patterns 4 formed in parallel with one another. These patterns 7 can be used as positioning patterns for electrical connection between wiring patterns 4 and light emitting elements 5, or as a measure for mounting positions of light emitting elements 5, so that the mounting process of the light emitting elements and the electrical connections thereof to the wiring patterns can be facilitated, and there is obtained another advantage that these patterns can also be used as recognition patterns when an automation apparatus is used.

In light emitting device 1 of the present invention, the linear distance between each light emitting element 5 and each wiring pattern 4 is preferably 0.1 mm or more, more preferably, to 0.5 mm or more. The linear distance here refers to a linear distance between each light emitting element 5 and each wiring pattern 4 in a direction along the substrate face of insulating substrate 3. By setting the linear distance to 0.1 mm or more, it is possible to positively ensure the electrical insulating property. It should be noted that from the viewpoint of preventing the dropping at the time of wire bonding and cutting of the bonding wire, the linear distance between each light emitting element 5 and each wiring pattern 4 is preferably 1.5 mm or less, more preferably, to 1.0 mm or less.

As shown in FIG. 2, light emitting device 1 of the present invention is preferably designed such that the thickness of wiring pattern 4 is smaller than the thickness of light emitting element 5. With this arrangement, it is possible to reduce shielding of the light emitted from light emitting elements 5 with the light released to the outside by the wiring patterns, and consequently to achieve a light emitting device 1 capable of efficiently emitting light to the outside. More specifically, the difference between the thickness of the above-mentioned area of each wiring pattern 4 and the thickness of light emitting element 5 is preferably 0.005 mm or more, more preferably, 0.07 mm or more.

It is only necessary for insulating substrate 3 in light emitting device 1 of the present invention to be formed with a material having an insulating property, and although not particularly limited, a white ceramic substrate is preferably used because of its small thermal expansion, high heat conductivity and high light reflectance. The "white color" here refers to a color of an object that allows the object to reflect virtually 100% of all the wavelengths of visible light rays (however, no such an ideal white color object having a reflectance of 100% exists). By using a white color ceramic substrate as insulating substrate 3, among outgoing light rays from light emitting elements 5, particularly those light rays proceeding toward the lower face can be reflected by the white color ceramic substrate, so that outgoing light rays from light emitting elements 5 can be effectively utilized without losses, and the resulting light emitting elements 5 can be suitably used for applications that require a high heat radiating property and a heat resistant property, and supply a large electric current as a driving electric current. Moreover, it becomes possible to improve reliability of light emitting elements 5, and in the case where sealing member 6 contains a fluorescent material (which will be described later), it also becomes possible to suppress degradation in the fluorescent material due to heat from light emitting elements 5, so that it is possible to make the light rays to be wavelength-converted and released from the fluorescent material less likely to cause chromaticity shifts. Furthermore, since the use of the ceramic substrate having a high light reflectance as described above eliminates the necessity of using silver having a light reflectance of 90% or more as the substrate material and/or the forming material for the wiring patterns, neither problem of silver migration nor sulfurized silver occurs.

When using the white color ceramic substrate, since a high level light reflectance, that is, 90% or more, is required, the material is preferably selected from aluminum oxide (alumina), aluminum nitride, boron nitride, silicon nitride, magnesium oxide, forsterite, steatite, and low-temperature sintered ceramics, or a ceramic substrate formed of a composite material of these materials is preferably used. Among these, a white ceramic substrate made of aluminum oxide (alumina) that is inexpensive, has high reflectance, is easily processed, and is widely used as an industrial material, is preferably used.

With respect to light emitting elements 5 to be used for light emitting device 1 of the present invention, light emitting elements that are normally used in the corresponding field can be used without limitations. Examples of such a light emitting element include semiconductor light emitting elements, such as a blue-color-based LED (light emitting diode) chip, an InGaAlP-based compound semiconductor LED chip, and an AlGaAs-based compound semiconductor chip, made by growing a material such as a gallium nitride-based compound semiconductor and a ZnO (zinc oxide)-based compound semiconductor on a substrate such as a sapphire substrate, a ZnO (zinc oxide) substrate, a GaN substrate, a Si substrate, a SiC substrate, and a spinel substrate. Among these, since a one-sided structure with two electrodes is easily formed on an insulating substrate and since a nitride semiconductor having superior crystallinity can be formed with high mass productivity, a blue-color-based LED made by growing a gallium nitride-based compound semiconductor on a sapphire substrate is preferably used as a light emitting element. In the case where such a blue-color-based LED is used as the light emitting element, a light emitting device is preferably designed so as to obtain white color by dispersing a fluorescent material that is excited by light from the semiconductor light emitting element to emit yellowish light in a sealing member (which will be described later).

With respect to the light emitting elements used for the light emitting device of the present invention, the color of light emission is not limited to a blue-color light emission, and light emitting elements having a light-emission color, such as an ultraviolet-ray light emission and a green-color light emission, may of course be used. Moreover, another light emitting device may of course be achieved in which, in place of the arrangement that, by using a blue-color-based LED as a light emitting element, light rays emitted from this blue-color-based LED are converted by a fluorescent material to obtain white color, by using three-colored LED chips of red, green, and blue as the light emitting elements without using the fluorescent material, light rays having required colors such as white color for illumination, are obtained.

Although not particularly limited, the shape of light emitting elements 5 used in light emitting device 1 of the present invention is preferably prepared as a rectangular shape in top view, as described earlier, and more preferably, as an elongated shape. It should be noted that in light emitting device 1 of the present invention, each light emitting element 5 in which a P-side electrode and an N-side electrode are formed on one of the faces needs to be used. Such a light emitting element 5 is mounted between wiring patterns 4 on insulating substrate 3, with the face having the P-side electrode and the N-side electrode formed thereon as the upper face, and electrically connected to wiring patterns 4.

As shown in FIG. 2, the electrical connection between light emitting elements 5 and wiring patterns 4 is made by bonding the P-side electrode and the N-side electrode to wiring patterns 4 through bonding wires W. With respect to the bonding wires W, any of metal thin wires conventionally used in the corresponding field may be used without particular limitations. Examples of the metal thin wires include a gold wire, an aluminum wire, a copper wire, and a platinum wire, and among these, the gold wire, which is less likely to corrode, good in moisture resistance, environmental resistance, adhesion, electrical conductivity, thermal conductivity, and elongation percentage, and easily formed into a ball, is preferably used as bonding wire W.

The light emitting device 1 of the present invention has a structure in which a plurality of light emitting elements 5 mounted between wiring patterns 4 while being electrically connected to wiring patterns 4 as described above are sealed by a sealing member 6 together with bonding wires W that make the electrical connection. The sealing process by sealing member 6 may be carried out by forming a plurality of linear sealing members so as to contain light emitting elements 5 mounted along the two sides of each linear wiring pattern 4, or may be carried out by sealing all the linear wiring patterns and light emitting elements on the insulating substrate by using one sealing member. From the viewpoints of reducing luminescence irregularities of the light emitting device and of reducing variation in the thickness of the sealing member, as shown in examples of FIGS. 1 to 3, it is preferable to seal all the linear wiring patterns and light emitting elements on the insulating substrate by using one sealing member.

The material (sealing material) used for forming sealing member 6 in light emitting device 1 of the present invention is not particularly limited, and any of materials conventionally widely known in the corresponding field may appropriately be used as long as it is a material having a light-transmitting property. Examples of the sealing material include light-transmitting resin materials having superior weather resistance, such as an epoxy resin, a urea resin and a silicone resin, and light-transmitting inorganic materials having superior resistance to light, such as silica sol and glass.

Sealing member 6 in the present invention is preferably contain a fluorescent material so as to be adjustable to obtain desirable light and to easily obtain white color, neutral white color, incandescent lamp color, and the like. Preferable examples of the fluorescent material include: Ce:YAG (cerium-activated yttrium-aluminum-garnet) fluorescent material, Eu:BOSE (europium-activated strontium-barium-orthosilicate) fluorescent material, and europium-activated α-sialon fluorescent material; however, the present invention is not intended to be limited thereto.

It should be noted that sealing member 6 of the present invention may contain a dispersing agent together with the fluorescent material. Although not particularly limited, preferable examples of the dispersing agent include barium titanate, titanium oxide, aluminum oxide, silicon oxide, calcium carbonate and silicon dioxide.

Sealing member 6 in the present invention can be achieved by using two layers in accordance with the chromaticity of desired light for light emitting device 1. In this case, as shown in FIG. 2, the structure is preferably designed to have a first sealing member layer 8 containing a first fluorescent material and a second sealing member layer 9 containing a second fluorescent material that is laminated on first sealing member layer 8. By forming sealing member 6 using first sealing member layer 8 and second sealing member layer 9 in this manner, it becomes possible to provide a light emitting device in which the chromaticity may be easily adjusted and which is free from chromaticity shifts can advantageously be provided at a low cost with a high yield. Desirable specific examples include processes in which methyl silicone is used as a resin material, and Eu:BOSE is dispersed therein as a first fluorescent material to be cured to form first sealing member layer 8, and organic modified silicone is used as a resin material so as to cover this first sealing member layer 8, and Eu:SOSE is dispersed therein as a second fluorescent material to be cured to form second sealing member layer 9. From the viewpoint of adjusting colors for correcting chromaticity shifts, second sealing member layer 9 is preferably laminated on first sealing member layer 8 so as to cover at least one portion of the upper face of first sealing member layer 8, and as shown in FIG. 2, more preferably, the structure is preferably achieved by covering the entire upper face of first sealing member layer 8 with second sealing member layer 9. In the case where a light emitting device that emits light having desired chromaticity is obtained with only one layer (first fluorescent material layer), sealing member 6 may of course be formed in a single layer. The border between first sealing material layer 8 containing the first fluorescent material and second sealing material layer 9 containing the second fluorescent material may be clearly separated from each other, or need not be clearly separated from each other.

Although not particularly limited, the shape of sealing member 6 of the present invention is preferably a hexagonal shape, a round shape, a rectangular shape or a square shape in top view. For example, FIGS. 1 to 3 show examples in which first sealing member layer 8 is formed into a square shape in top view, with second sealing member layer 9 having a square shape in top view being formed so as to cover the entire upper face of first sealing member layer 8. It should be noted that the top shapes of the above-mentioned sealing member 6, first sealing member layer 8, and second sealing member layer 9 refer to the shape on a cross section in parallel with the substrate face of insulating substrate 3.

Figure 4:
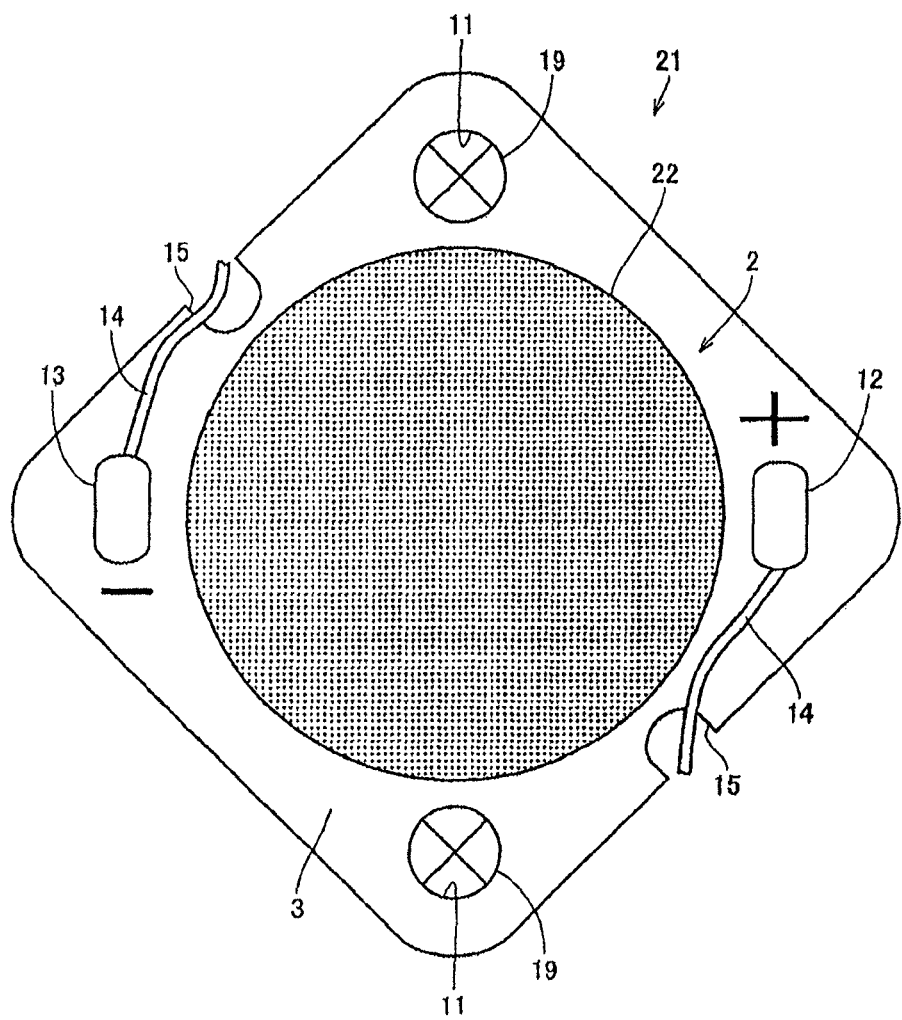
FIG. 4 is a top view schematically showing a light emitting device 21 in accordance with a second preferred example of the present invention.

FIG. 4 is a top view showing a light emitting device 21 in accordance with a second preferred example of the present invention. In the example of FIG. 4, light emitting device 21 has the same structure as that of light emitting device 1 shown in the example of FIG. 1 except that the top shape of a sealing member 22 is a round shape; therefore, those members having similar structures are indicated by the same reference numerals, and the description thereof is omitted.

As shown in FIG. 4, since sealing member 22 is designed to have a round top shape, the resulting symmetrical shape advantageously provides good light directivity. For this reason, among the above-mentioned hexagonal shape, round shape, rectangular shape, and square shape, as shown in FIG. 4, sealing member 22 is in particular preferably designed to have a round top shape.

Moreover, the sealing member 6 may be formed into a semi-spherical shape with an upward convex portion. In this case, sealing member 6 is allowed to have a function as a lens.

Although not particularly limited, the entire shape of light emitting device 1 of the present invention is preferably designed to have a hexagonal shape, a round shape, a rectangular shape or a square shape in top view. In the case where the light emitting device has a rectangular or square top shape, since the light emitting device can be disposed in a tightly contact state, the resulting light emitting device can be suitably applied to a fluorescent lighting-type LED lamp. Moreover, in the case where the light emitting device is applied to a light-bulb-type LED lamp (which will be described later), the light emitting device is preferably designed to have a round top shape. FIGS. 1 and 4 show examples in which light emitting device 1 is designed to have a square top shape, as described above.

Figure 5:
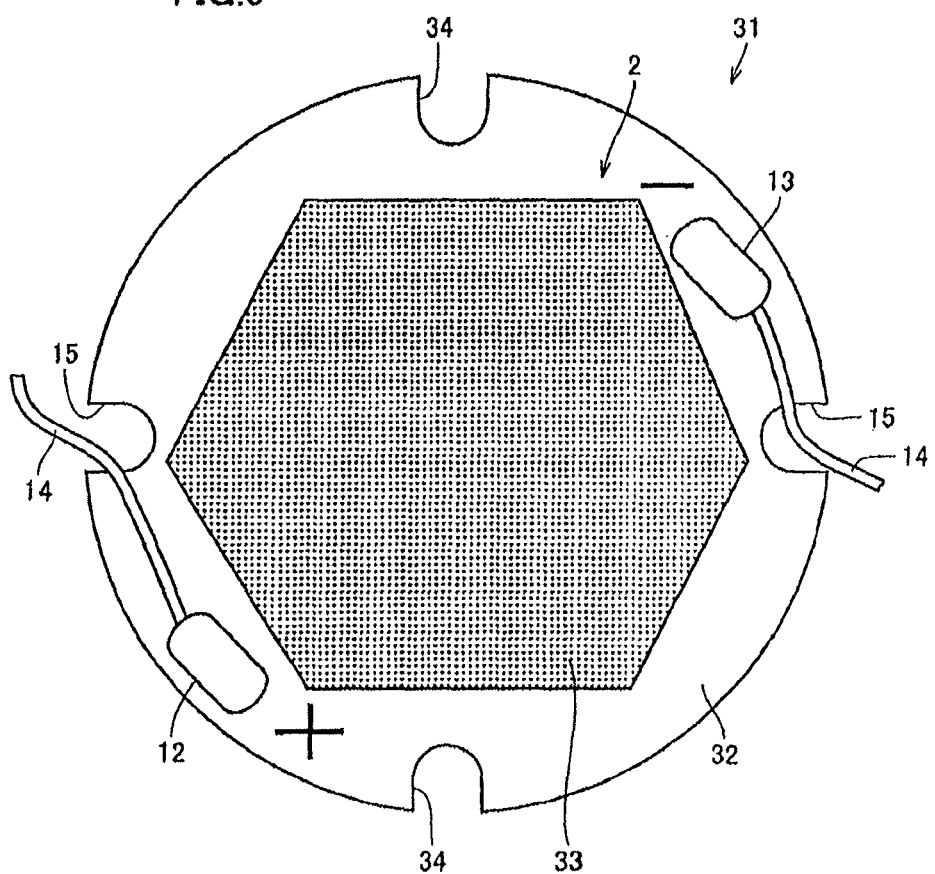
FIG. 5 is a top view schematically showing a light emitting device 31 in accordance with a third preferred example of the present invention.

FIG. 5 is a top view showing a light emitting device 31 in accordance with a third preferred example of the present invention. In the example of FIG. 5, light emitting device 31 has the same structure as that of light emitting device 1 shown in the example of FIG. 1 except that the top shape of a sealing member 33 is a hexagonal shape and that the top shape of light emitting device 31 is a round shape; therefore, those members having similar structures are indicated by the same reference numerals, and the description thereof is omitted. As in light emitting device 31 shown in the example of FIG. 5, since sealing member 33 is designed to have a hexagonal top shape, the resulting symmetrical shape advantageously provides good light directivity. Moreover, as shown in the example of FIG. 5, light emitting device 31 having a round top shape (using an insulating substrate 32 having a round top shape) is suitably applicable to a light-bulb-type LED lamp.

Figure 6:
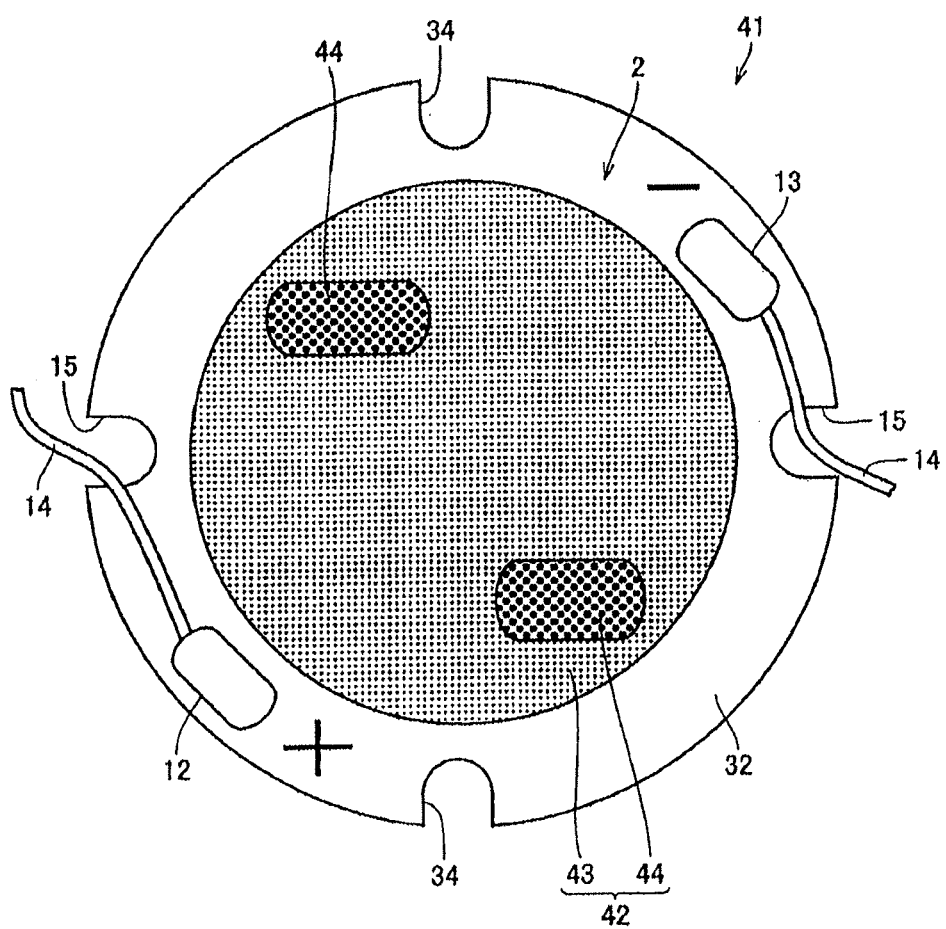
FIG. 6 is a top view schematically showing a light emitting device 41 in accordance with a fourth preferred example of the present invention.

FIG. 6 is a top view showing a light emitting device 41 in accordance with a fourth preferred example of the present invention. In the example of FIG. 6, light emitting device 41 has the same structure as that of light emitting device 31 shown in the example of FIG. 5 except that the top shape of a sealing member 42 (first sealing member layer 43) is a round shape and that a second sealing member layer 44 is formed in such a manner as to cover only one portion of the upper face of first sealing member layer 43; therefore, those members having similar structures are indicated by the same reference numerals, and the description thereof is omitted. As shown by light emitting device 41 in the example of FIG. 6, since sealing member 42 is designed to have a round top shape, the resulting symmetrical shape advantageously provides good light directivity. Moreover, in the example of FIG. 6, first sealing member layer 43 formed to have a round top shape and second sealing member layer 44 formed to partially cover first sealing member layer 43 form sealing member 42. By forming second sealing member layer 44 in such a manner as to partially cover first sealing member layer 43, only one portion of the first sealing member layer can be adjusted so that a light emitting device having a desired chromaticity characteristic as a light emitting device (for example, within a range of (b) in FIG. 13 indicating chromaticity coordinates, which will be described later) is advantageously obtained. In this case, the portion of first sealing member layer 43 to be covered by second sealing member layer 44 is selected in accordance with a desired chromaticity characteristic (for example, on first sealing member layer 43, the portion that is not within the range of (b) in FIG. 13 indicating the desired chromaticity coordinates to be described later, is covered by second sealing member layer 44). Moreover, in the case of light emitting device 41 in the example shown in FIG. 6, since it has a round top shape, it is suitably applied to a light-bulb-type LED lamp in the same manner as light emitting device 31 in the example shown in FIG. 5.

Figure 7:
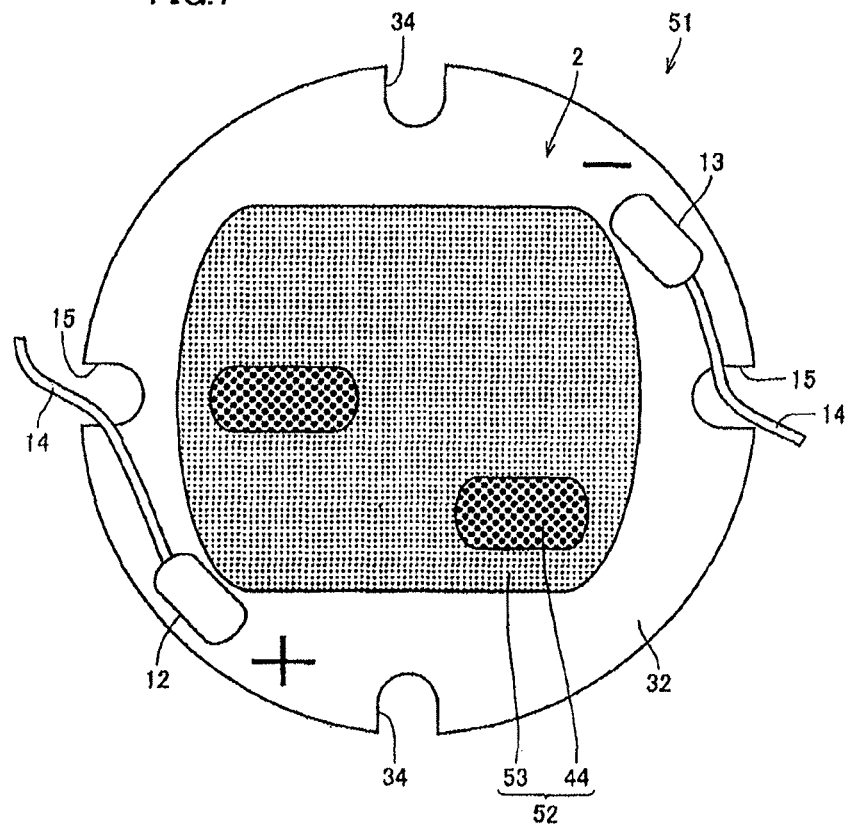
FIG. 7 is a top view schematically showing a light emitting device 51 in accordance with a fifth preferred example of the present invention.

FIG. 7 is a top view showing a light emitting device 51 in accordance with a fifth preferred example of the present invention. In the example of FIG. 7, light emitting device 51 has the same structure as that of light emitting device 31 shown in the example of FIG. 5 except that the top shape of a sealing member 52 (first sealing member layer 53) is a square shape and that second sealing member layer 44 is formed in such a manner as to cover only one portion of the upper face of first sealing member layer 53; therefore, those members having similar structures are indicated by the same reference numerals, and the description thereof is omitted. As shown by light emitting device 51 shown in the example of FIG. 7, since sealing member 52 (first sealing member layer 53) is designed to have a square top shape, the resulting shape advantageously ensures an area which allows a securing hole, an external wiring hole, and the like to be formed therein. Moreover, in the example of FIG. 7, first sealing member layer 53 formed to have a square top shape and second sealing member layer 44 formed to partially cover first sealing member layer 53 form sealing member 52, and this structure exerts similar effects to those of the example shown in FIG. 6. Moreover, in the case of light emitting device 51 in the example shown in FIG. 7, since it has a round top shape, it is suitably applied to a light-bulb-type LED lamp in the same manner as light emitting devices 31 and 41 in the examples shown in FIGS. 5 and 6. The above-mentioned first sealing member layer 43 and first sealing member layer 53 contain a first fluorescent material, and second sealing member layer 44 contains a second fluorescent material.

In accordance with the present invention, it is possible to provide a light emitting device that is easily manufactured, and is less likely to produce color shifts. Such a light emitting device of the present invention can in particular suitably be used as a backlight light source of a liquid crystal display or a light source for illumination. By using the light emitting device of the present invention, it is possible to achieve the light source having any color tone including white color, such as a light bulb color.

In order to use for the above-mentioned application, the light emitting device of the present invention normally has securing holes used for attaching and securing to a matching member. In light emitting devices 1 and 21 having a square top shape shown in FIGS. 1 and 4, one securing hole 11 formed to penetrate insulating substrate 3 is disposed along a diagonal line at each of the opposing corner portions of insulating substrate 3 having a square shape in top view. Moreover, in light emitting devices 31, 41 and 51 each having a round top shape shown in FIGS. 5 to 7, one securing hole 34 formed as a cut-out section is formed and disposed along each of straight lines passing through the center of insulating substrate 32 having a round shape in top view.

In order to use for the above-mentioned application, the light emitting device of the present invention is attached to a matching member to be secured thereto by using a securing jig. With respect to the securing jig, for example, a securing jig 19 as shown in FIGS. 1 and 4, which is a screw to be inserted into each securing hole 11 with a threaded inner wall and engaged therewith, is used. Moreover, the securing jig may be prepared as a bonding sheet or the like.

The light emitting device of the present invention is preferably secured by using a securing jig made of the same material as that of the insulating substrate. By using the securing jig made of the same material as that of the insulating substrate, the thermal expansion coefficient of the insulating substrate and the thermal expansion coefficient of the securing jig are made equal to each other, so that it becomes possible to prevent cracks and crevices from occurring in the insulating substrate due to warping or the like by heat, and consequently to improve the yield of the light emitting device. More specifically, any of materials selected from aluminum oxide, aluminum nitride, boron nitride, silicon nitride, magnesium oxide, forsterite, steatite, and low-temperature sintered ceramics, or a composite material of these materials, is suitably used for the securing jig as well as for the forming material for the insulating substrate.

Figure 8:
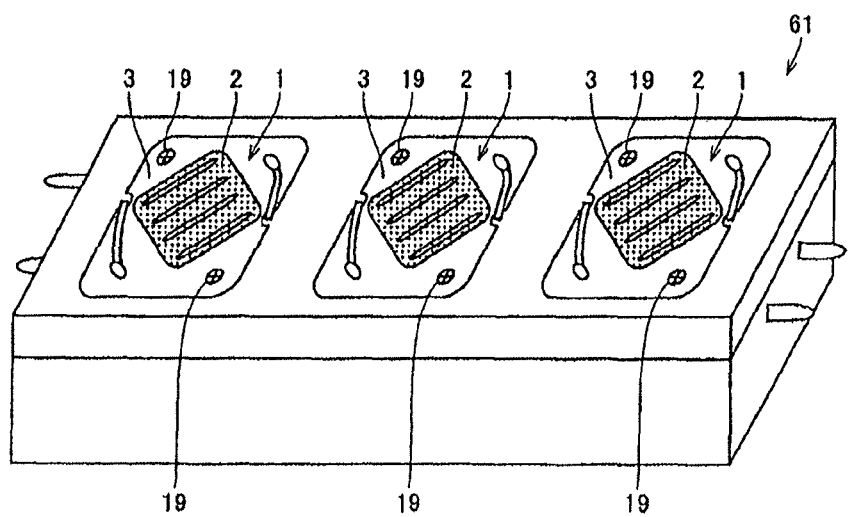
FIG. 8 is a perspective view illustrating a case in which light emitting device 1 of the example shown in FIG. 1 is applied to a fluorescent lighting-type LED lamp 61.
Figure 9:
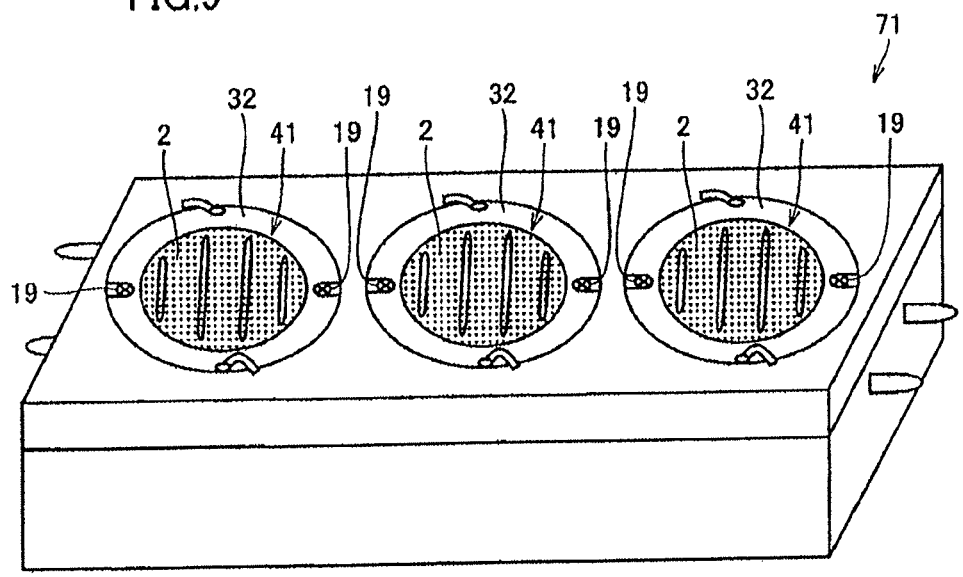
FIG. 9 is a perspective view illustrating a case in which light emitting device 41 of the example shown in FIG. 6 is applied to a fluorescent lighting-type LED lamp 71.
Figure 10:
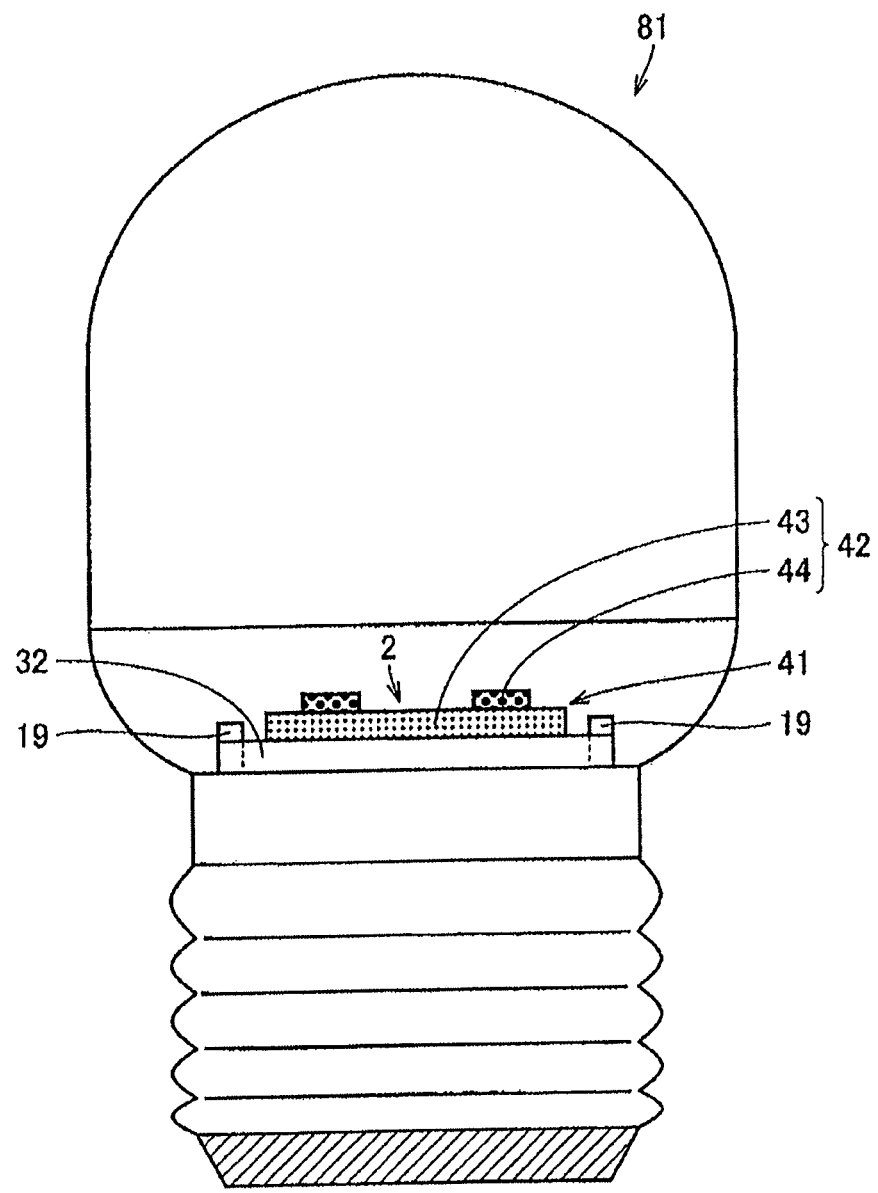
FIG. 10 is a perspective view illustrating a case in which light emitting device 41 of the example shown in FIG. 6 is applied to a light bulb-type LED lamp 81.

FIGS. 8 to 10 show examples in which the light emitting device of the present invention is used as a light source for illumination. FIG. 8 is a perspective view illustrating a case in which light emitting device 1 of the example shown in FIG. 1 is applied to a fluorescent lighting-type LED lamp 61, FIG. 9 is a perspective view illustrating a case in which light emitting device 41 of the example shown in FIG. 6 is applied to a fluorescent lighting-type LED lamp 71 (second fluorescent material layer 44 partially covering first fluorescent material layer 43 is omitted), and FIG. 10 is a top view illustrating a case in which light emitting device 41 of the example shown in FIG. 6 is applied to a light bulb-type LED lamp 81. As shown in FIGS. 8 to 10, light emitting devices 1 and 41 are attached and secured through securing holes 11 and 34 respectively, by using securing jigs 19.

It should be noted that, as shown in each of FIGS. 1 and 4 to 7, the light emitting device of the present invention is preferably designed to have a structure in which a positive electrode externally connecting land 12 and a negative electrode externally connecting land 13 are directly provided on each of insulating substrates 3 and 32, with externally connecting wires 14 used for electrically connecting these positive electrode externally connecting land 12 and negative electrode externally connecting land 13 to a power supply (not shown) being provided thereto.

Moreover, as shown in each of FIGS. 1 and 4 to 7, the light emitting device of the present invention is preferably designed to have a structure in which external wiring holes 15 which allow externally connecting wires 14 to pass through are formed on each of insulating substrates 3 and 32. In the examples shown in FIGS. 1 and 4, on insulating substrate 3 having a square top shape, positive electrode externally connecting land 12 and negative electrode externally connecting land 13 are provided to be disposed on another diagonal line that is different from the diagonal line on which the aforementioned securing holes 11 are provided, and external wiring holes 15, each having a cut-out shape, are formed on opposing two sides near the center thereof of insulating substrate 3. Moreover, in the examples shown in FIGS. 5 to 7, on insulating substrate 32 having a round top shape, externally wiring holes 15, each having a cut-out shape, are formed on a straight line that passes through the center and is substantially perpendicular to the straight line passing through the center on which securing holes 34 are formed as described above, and positive electrode externally connecting land 12 and negative electrode externally connecting land 13 are each formed between securing holes 34 and externally wiring holes 15 so as to be made face to face with each other. It should be noted that, as shown in each of the examples of FIGS. 4 to 7, in the case where securing holes 34 and externally wiring holes 15 are formed as cut-out sections on insulating substrate 32 having a round top shape, the resulting structure also exerts a rotation-stopping function for preventing the light emitting device from rotating in a circumferential direction in a state of being attached to a matching member.

Moreover, as shown in FIG. 3, the light emitting device of the present invention is preferably designed to have a structure in which on insulating substrate 3, externally lead-out wiring patterns 16 and 17 that electrically connect ends of wiring patterns 4 to positive electrode externally connecting land 12 and negative electrode externally connecting land 13 are further formed. By using these externally lead-out wiring patterns 16 and 17, the power supply (not shown) and wiring patterns 4 can be electrically connected to each other through positive electrode externally connecting land 12 and externally lead-out wiring pattern 16, and negative electrode externally connecting land 13 and externally lead-out wiring pattern 17.

Moreover, the light emitting device of the present invention is preferably provided with an inspecting pattern formed on the insulating substrate. FIG. 3 shows an example in which spot-shaped inspecting patterns 18 are formed between a wiring pattern 4a and a wiring pattern 4b as well as between a wiring pattern 4c and a wiring pattern 4d. By forming these inspecting patterns 18 on insulating substrate 3, conduction inspecting processes between wiring pattern 4a and wiring pattern 4b, between wiring pattern 4b and wiring pattern 4c, as well as between wiring pattern 4c and wiring pattern 4d, can be easily carried out by using inspecting patterns 18. Moreover, these inspecting patterns 18 may also be used as recognition patterns to be used in carrying out die bonding and wire bonding processes by an automation apparatus. It should be noted that the inspecting pattern is not limited to the spot-shaped pattern as shown in FIG. 3, and it may be prepared as a pattern that is electrically connected to both wiring pattern 4b and wiring pattern 4c and has a size that allows a probe to be made in contact therewith.

Figure 11:
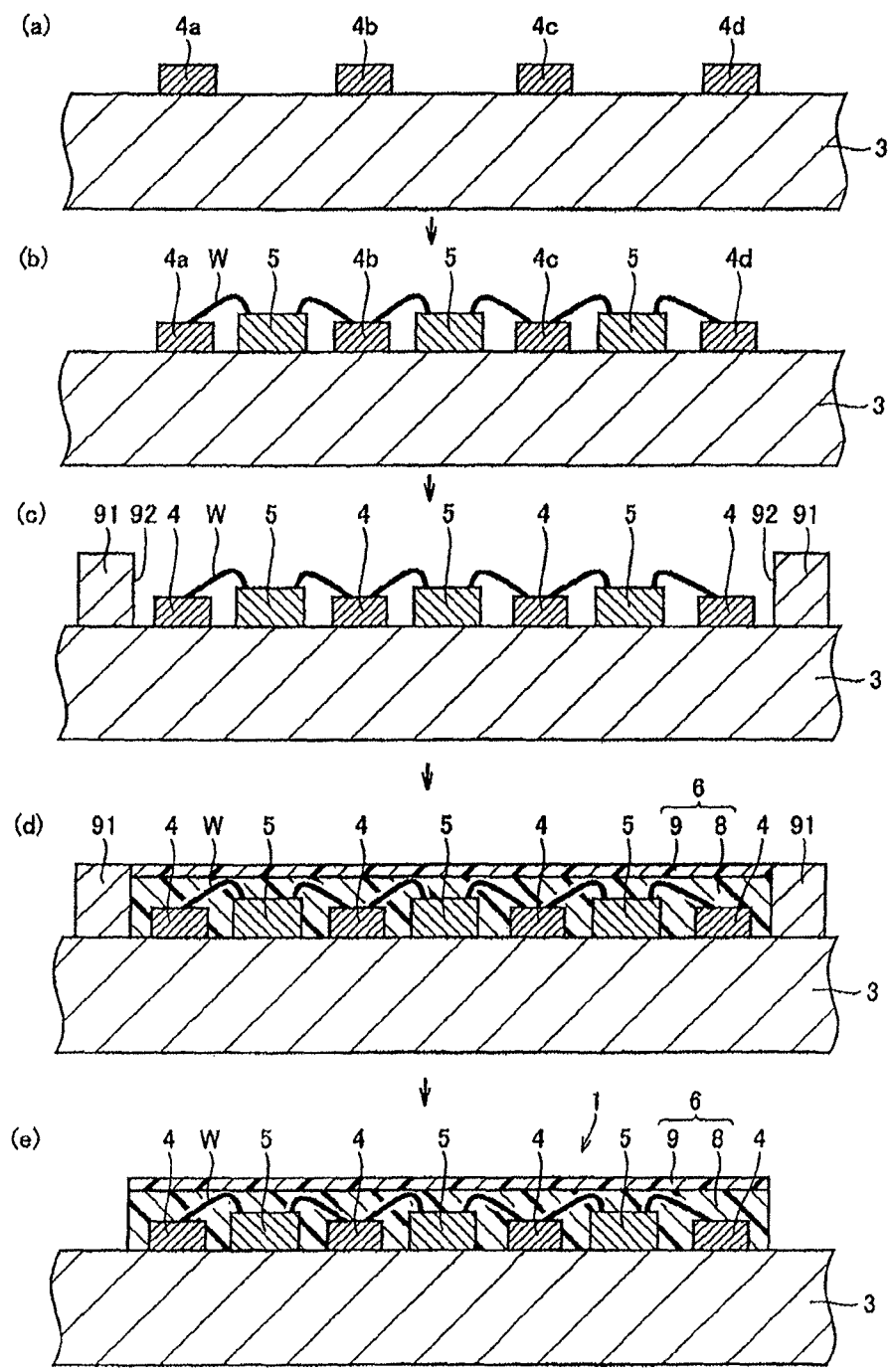
FIG. 11 is a diagram showing step by step a preferred example of a manufacturing method for a light emitting device of the present invention.

The present invention also provides a method for manufacturing a light emitting device. Although the method for manufacturing the above-mentioned light emitting device of the present invention is not particularly limited, it is suitably manufactured by using the method for manufacturing a light emitting device of the present invention. The method for manufacturing a light emitting device of the present invention basically includes a process for forming wiring patterns on an insulating substrate, a process for mounting a light emitting element between wiring patterns, a process for electrically connecting the light emitting element and the wiring patterns, a process for placing a silicone rubber sheet having a through hole onto the insulating substrate, and a process for forming a sealing member for sealing the light emitting element in the through hole of the silicone rubber sheet. FIG. 11 is a diagram showing processes for manufacturing light emitting device 1 shown in FIG. 1 step by step, as one preferred example of a method for manufacturing a light emitting device of the present invention. Referring to FIG. 11, the method for manufacturing the light emitting device of the present invention will be discussed in detail in the following description.

First, as shown in FIG. 11(*a*), wiring patterns 4 are formed on an insulating substrate 3. As described above, since FIG. 11 shows the case in which light emitting device 1 shown in FIG. 1 is manufactured, four linear wiring patterns 4a, 4b, 4c, and 4d are disposed in parallel with one another on insulating substrate 3, as wiring patterns 4. In one preferable specific example, on white insulating substrate 3 made of aluminum oxide having a thickness of 1 mm, a gold film having a thickness of 0.07 mm is formed by using a sputtering method, and wiring patterns 4a, 4b, 4c, and 4d (1 mm in width, at 2 mm intervals) are then formed thereon by a photo-etching method; however, the present invention is not limited by this method. In the case of forming a pattern that is expanded outwards from a straight line as a pattern 7 for use in positioning electrical connections with light emitting elements or for use as a measure for mounting positions of the light emitting elements, externally lead-out wiring patterns 16 and 17 and an inspecting pattern, desired patterns may be designed and subjected to photo-etching processes.

Next, as shown in FIG. 11(*b*), each of light emitting elements 5 is mounted between wiring patterns 4. The mounting of each light emitting element 5 can be carried out by directly bonding the light emitting element 5 to insulating substrate 3 using a thermosetting resin such as an epoxy resin, an acrylic resin and an imide resin. With this arrangement, the dielectric voltage, which is determined by the creeping discharge voltage, can be made as high as possible. That is, the dielectric voltage between the light emitting elements that are arranged in the electrode direction is determined by the distance between the light emitting elements and the dielectric constant of the insulating substrate, and the dielectric voltage between the light emitting element and the electrode is also determined by the shortest distance between the light emitting element and the electrode and the dielectric constant of the insulating substrate. In a preferable specific example, a LED chip having a short-side width of 0.24 mm, a long-side width of 0.48 mm, and a thickness of 0.14 mm is bonded to each of gaps between linear wiring patterns 4a, 4b, 4c, and 4d that are formed on insulating substrate 3 in parallel with one another, and secured therein, as light emitting element 5, by using an epoxy resin; however, the present invention is not limited thereto. Thereafter, as shown in FIG. 11(*b*), wiring patterns 4 and light emitting elements 5 are electrically connected with one another by using wire bonding W, in accordance with a desired state of electrical connection.

It should be noted that the method for manufacturing a light emitting device of the present invention preferably further includes a process for inspecting the characteristics of the light emitting elements after the above-mentioned electrical connection between the light emitting elements and the wiring patterns is made, and a process in which, upon detection of any defect in characteristics, a spare light emitting element is connected to the wiring patterns. This inspection can be carried out, for example, by flowing an electric current through the light emitting element so as to measure the optical output characteristics. Moreover, disconnection of bonding wire W and bonding defect may be checked in external appearance inspecting processes at the same time.

Figure 12:
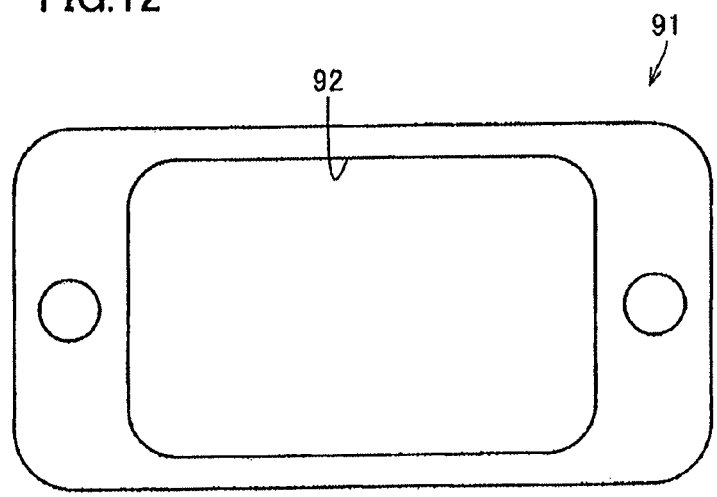
FIG. 12 is a diagram schematically showing a silicone rubber sheet 91 in accordance with a preferred example, which is used for the method for manufacturing a light emitting device of the present invention.

Next, as shown in FIG. 11(*c*), a silicone rubber sheet 91 having a through hole 92 is placed on insulating substrate 3. FIG. 12 is a diagram schematically showing silicone rubber sheet 91 as one preferred example to be used in the method for manufacturing a light emitting device of the present invention. The silicone rubber sheet to be used in the manufacturing method of the present invention has a through hole for providing a space in which the sealing member is formed, and the shape of the through hole is not particularly limited and may be formed into any shape in accordance with the top shape of a sealing member to be formed. As described earlier, since the sealing member is preferably formed to have a top shape such as a hexagonal shape, a round shape, a rectangular shape, and a square shape, the through hole of silicone rubber sheet 91 is preferably formed to have the corresponding top shape such as a hexagonal shape, a round shape, a rectangular shape, and a square shape. For example, FIG. 12 shows silicone rubber sheet 91 with a through hole 92 having a rectangular shape in top view. It should be noted that the silicone rubber sheet 91 having the above-mentioned through hole 92 is suitably used in a case in which all the linear wiring patterns and light emitting elements on the insulating substrate are sealed by a single sealing member; however, in the case where a plurality of linear sealing members are formed in such a manner as to include light emitting elements 5 mounted on the two sides along the linear wiring patterns 4, a silicone rubber sheet having a plurality of through holes with the desired corresponding shapes may be used.

Silicone rubber sheet 91, which is easily available and has an elasticity because it is made of rubber, is preferably used because it can be provided in a tightly contact state without a gap even when there is a difference in the form of a step in wiring patterns and the like. Moreover, to one of the surfaces of silicone rubber sheet 91, a double-sided bonding sheet is preliminarily bonded, since it can prevent leakage of resin used for forming the sealing member in the state of being disposed on insulating substrate 3, which will be described later, and since it is easily removed after formation of the sealing member, and silicone rubber sheet 91 is preferably bonded to insulating substrate 3 by this bonding sheet.

The silicone rubber sheet to be used in the method for manufacturing a light emitting device of the present invention is preferably designed to have a thickness that is two or more times thicker than the thickness of the first sealing member layer to be formed. By allowing the silicone rubber sheet to have two or more times thicker than the thickness of the first sealing member layer, it becomes possible to carry out a double coating process to correct chromaticity shifts, and consequently to prevent leakage of the sealing material.

Next, as shown in FIG. 11(d), sealing member 6 used for sealing light emitting elements 5 is formed in through hole 92 of silicone rubber sheet 91. Sealing member 6 preferably contain a fluorescent material, as described earlier. Moreover, sealing member 6 may be formed as either a single layer or two layers (since FIG. 11 shows processes for manufacturing light emitting device 1 shown in FIG. 1, sealing member 6 is formed to include a first sealing member layer 8 containing a first fluorescent material and a second sealing member layer 9 containing a second fluorescent material).

The process for sealing the light emitting elements by using this sealing member in the method for manufacturing a light emitting device of the present invention preferably includes a process for injecting a sealing material containing a first fluorescent material into the through hole of a silicone rubber sheet, a process for curing the sealing material containing the first fluorescent material to form a first sealing member layer, and a process for measuring a chromaticity characteristic of the light emitting device after the first sealing member layer is formed.

In this case, first, the sealing material containing the first fluorescent material is injected into through hole 92 of silicon rubber sheet 91. With respect to the sealing material, as described earlier, preferable examples include light-transmitting resin materials superior in weather resistance, such as an epoxy resin, a urea resin and a silicone resin, and light-transmitting inorganic materials, such as silica sol and glass, superior in resistance to light. Moreover, with respect to the first fluorescent material, as described earlier, preferable examples include: Ce:YAG fluorescent material, Eu:BOSE fluorescent material or Eu:SOSE fluorescent material, and europium-activated α-sialon fluorescent material. Moreover, the aforementioned dispersing agent may be added to the sealing material.

Next, the sealing material containing the first fluorescent material, injected into through hole 92 of silicone rubber sheet 91, is cured. The method for curing the sealing material is not particularly limited, and any conventionally known method may appropriately be used in accordance with the sealing material to be used. For example, in the case where a silicone resin that is a light-transmitting resin material is used as the sealing material, the sealing material can be cured by thermally curing the silicone resin. It should be noted that a resin for use in molding may be used as the sealing material, and the sealing material may be cured by using a metal mold. The shape of the sealing member (the first sealing member layer) to be formed by curing the sealing material is not particularly limited, and for example, a sealing member having a semi-spherical shape with an upward convex portion may be made so that the sealing member is allowed to function as a lens.

Figure 13:
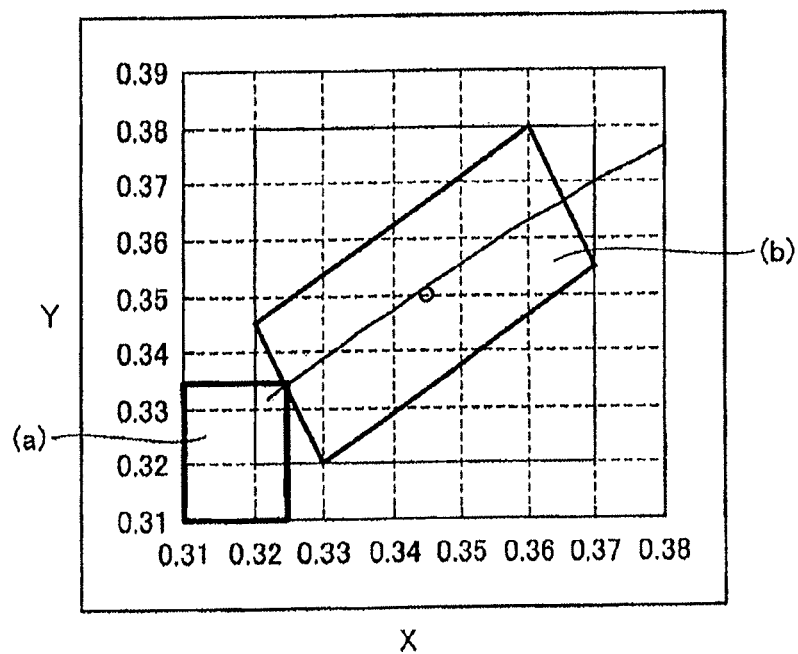
FIG. 13 is a graph showing chromaticity coordinates of CIE.

Next, the chromaticity characteristics of the light emitting device having the first sealing member layer formed thereon as described above are measured. FIG. 13 is a graph that shows chromaticity coordinates of CIE (Commission Internationale del'Eclairage). The chromaticity characteristics of the light emitting device can be measured by using a measuring device which uses an optical system of d·8 (diffused lighting·8°: light-receiving system) in accordance with DIN5033teil7, ISOk772411 under the condition C of JIS Z 8722. For example, in the case where, in order to obtain light that corresponds to x, y=(0.325, 0.335) on the CIE chromaticity diagram, a material prepared by mixing the first fluorescent material and a silicone resin serving as the sealing material at a weight ratio of 5:100 is injected into through hole 92 of silicone rubber sheet 91, and thermally cured at 150° C. for 30 minutes to form the first sealing member layer, the chromaticity range of the first sealing member layer thus formed is located within a region (a) in FIG. 13. In the case of measuring chromaticity characteristics of the light emitting device having the first sealing member layer of this kind, the chromaticity range goes out of the region (b) in FIG. 13. In such a case, a second sealing member layer is formed on the first sealing member layer so that the chromaticity range of the light emitting device is located within the region (b) in FIG. 13.

In the case where the second sealing member layer is formed, the method for manufacturing a light emitting device of the present invention preferably further includes the following processes after the above-mentioned process for measuring the chromaticity characteristics of the light emitting device after the formation of the first sealing member layer: a process for pouring a sealing material containing a second fluorescent material onto the first sealing member layer, a process for curing the sealing material containing the second fluorescent material to form a second sealing member layer, a process for measuring chromaticity characteristics of the light emitting device after the formation of the second sealing member layer, and a process for removing the silicone rubber sheet. That is, in the same manner as in the respective processes for forming the above-mentioned first sealing member layer, first, the sealing material containing the second fluorescent material is poured onto the first sealing member layer, and cured thereon to form the second sealing member layer. The second fluorescent material and sealing material used for forming the second sealing member layer are appropriately selected from the first fluorescent material and sealing materials used for forming the aforementioned first sealing member layer, in accordance with desired chromaticity characteristics, and may be prepared by further adding a dispersing agent thereto in some cases. In the above-mentioned case, in order to obtain light that corresponds to x, y=(0.345, 0.35) on the CIE chromaticity diagram, for example, a material prepared by mixing the second fluorescent material and a silicone resin serving as the sealing material at a weight ratio of 2:100 is poured onto the first sealing member layer, and thermally cured at 150° C. for one hour to form the second sealing member layer. With this arrangement, in the case of measuring likewise the chromaticity characteristics of the light emitting device after the formation of the second sealing member layer, the resulting light emitting device can have a chromaticity range that is located within the region (b) in FIG. 13.

In this manner, by further forming the second sealing member layer as needed, the method for manufacturing a light emitting device of the present invention makes it possible to manufacture a light emitting device free from chromaticity shifts at a low cost with a high yield. It should be noted that, as described above, it is only necessary for the second sealing member layer to cover at least one portion of the upper face of the first sealing member layer, and it may cover the entire upper face of the first sealing member layer (for example, the examples shown in FIGS. 1, 4, and 5), or may partially cover the upper face of the first sealing member layer (for example, the examples shown in FIGS. 6 and 7).

Moreover, for example, in the case where, in order to obtain light that corresponds to x, y=(0.325, 0.335) on the CIE chromaticity diagram, a material prepared by mixing the first fluorescent material and a silicone resin serving as the sealing material at a weight ratio of 5:80 is injected into through hole 92 of silicone rubber sheet 91, and thermally cured at 120° C. for 30 minutes to form the first sealing member layer, in measuring the chromaticity characteristics of the light emitting device after the formation of the first sealing member layer, the chromaticity range thereof is located within the region (b) in FIG. 13; therefore, in this case, it is not necessary to further form the aforementioned second sealing member layer, and the light emitting device having the first sealing member layer as it is as the sealing member may be manufactured.

In the method for manufacturing a light emitting device of the present invention, as described above, after the first sealing member layer alone has been formed, or after the first and second sealing member layers have been formed, silicone rubber sheet 91 is removed, so that the light emitting device of the present invention is provided. As described earlier, silicon rubber sheet 91 may be prepared with a two-sided bonding sheet being preliminarily bonded to one of the faces thereof, and then bonded to insulating substrate 3 by using this bonding sheet; thus, silicone rubber sheet 91 can easily be removed. It should be noted that the silicone rubber sheet can be used repeatedly.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A light emitting device comprising:
   a substrate having a top surface and a bottom surface opposite from the top surface, the substrate including a lighting area and a peripheral area surrounding the lighting area in the top surface of said substrate;
   a positive electrode land exposed for external connection on the top surface and a negative electrode land exposed for external connection on the top surface, said positive and negative electrode lands being provided on the peripheral area of said substrate;
   wiring patterns including a cathode wiring pattern and an anode wiring pattern disposed on the top surface of said substrate and connected to said positive and negative electrode lands, respectively;
   a light emitting unit formed on the lighting area of said substrate, including a plurality of light emitting elements electrically connected between the cathode and anode wiring patterns, and a sealing member for sealing and continuously covering the plurality of light emitting elements, the sealing member being located within the lighting area; and
   a positive polarity symbol provided on the top surface in the peripheral area and adjacent to said positive electrode land,
   wherein the positive electrode land and the negative electrode land are disposed on the peripheral area of the top surface so that the positive and negative electrode lands do not extend over an edge of the substrate,
   the positive electrode land and the negative electrode land are disposed on the peripheral area of the top surface opposite to each other so as to have the light emitting unit between the lands such that the lands do not overlap the light emitting unit,
   a first lead-out wiring pattern is disposed between the positive electrode land and the anode wiring pattern, and
   a second lead-out wiring pattern is disposed between the negative electrode land and the cathode wiring pattern.

2. The light emitting device of claim 1, further comprising a negative polarity symbol provided on the peripheral area in the top surface of said substrate and adjacent to said negative electrode land.

3. The light emitting device of claim 1, wherein the sealing member is composed of a light-transmitting resin.

4. The light emitting device of claim 3, wherein the sealing member contains a fluorescent material.

5. The light emitting device of claim 3, wherein the light-transmitting resin is a silicone resin.

6. The light emitting device of claim 1, wherein a through hole penetrating the substrate is formed in the peripheral area.

7. The light emitting device of claim 1, wherein the substrate is shaped as one of a hexagon, a rectangle and a square.

8. The light emitting device of claim 1, wherein the substrate has a thickness of about 1 mm.

9. The light emitting device of claim 1, wherein a hole having a cut-out shape and penetrating the substrate is formed in the peripheral area.

10. The light emitting device of claim 1, wherein the positive electrode land is large in width than the first lead-out wiring pattern, and the negative electrode land is large in width than the second lead-out wiring pattern.

11. A light emitting device comprising:
a substrate having a top surface and a bottom surface opposite from the top surface, the substrate including a lighting area and a peripheral area surrounding the lighting area in the top surface of said substrate;
a positive electrode land exposed for external connection on the top surface and a negative electrode land exposed for external connection on the top surface, said positive and negative electrode lands being provided on the peripheral area of said substrate;
wiring patterns including a cathode wiring pattern and an anode wiring pattern disposed on the top surface of said substrate and connected to said positive and negative electrode lands, respectively;
a light emitting unit formed on the lighting area of said substrate, including a plurality of light emitting elements electrically connected between the cathode and anode wiring patterns, and a sealing member for sealing and continuously covering the plurality of light emitting elements, the sealing member being located within the lighting area; and
a negative polarity symbol provided on the top surface in the peripheral area and adjacent to said negative electrode land,
wherein the positive electrode land and the negative electrode land are disposed on the peripheral area of the top surface so that the positive and negative electrode lands do not extend over an edge of the substrate,
the positive electrode land and the negative electrode land are disposed on the peripheral area of the top surface opposite to each other so as to have the light emitting unit between the lands such that the lands do not overlap the light emitting unit,
a first lead-out wiring pattern is disposed between the positive electrode land and the anode wiring pattern, and
a second lead-out wiring pattern is disposed between the negative electrode land and the cathode wiring pattern.

12. The light emitting device of claim 11, wherein the sealing member is composed of a light-transmitting resin.

13. The light emitting device of claim 12, wherein the sealing member contains a fluorescent material.

14. The light emitting device of claim 12, wherein the light-transmitting resin is a silicone resin.

15. The light emitting device of claim 11, wherein a through hole penetrating the substrate is formed in the peripheral area.

16. The light emitting device of claim 11, wherein the substrate is shaped as one of a hexagon, a rectangle and a square.

17. The light emitting device of claim 11, wherein the substrate has a thickness of about 1 mm.

18. The light emitting device of claim 11, wherein a hole having a cut-out shape and penetrating the substrate is formed in the peripheral area.

19. The light emitting device of claim 11, wherein the positive electrode land is large in width than the first lead-out wiring pattern, and the negative electrode land is large in width than the second lead-out wiring pattern.

* * * * *